(12) United States Patent
Gupta et al.

(10) Patent No.: US 9,263,973 B2
(45) Date of Patent: Feb. 16, 2016

(54) MEMS ELECTROSTATIC ACTUATOR

(71) Applicant: TEXAS INSTRUMENTS INCORPORATED, Dallas, TX (US)

(72) Inventors: Arun Kumar Gupta, Dallas, TX (US); William Craig McDonald, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/691,962

(22) Filed: Apr. 21, 2015

(65) Prior Publication Data
US 2015/0229241 A1 Aug. 13, 2015

Related U.S. Application Data

(63) Continuation of application No. 13/614,936, filed on Sep. 13, 2012, now Pat. No. 9,040,854.

(60) Provisional application No. 61/606,041, filed on Mar. 2, 2012, provisional application No. 61/534,157, filed on Sep. 13, 2011.

(51) Int. Cl.
*H01H 57/00* (2006.01)
*H02N 2/12* (2006.01)
*B81B 3/00* (2006.01)
*B81B 7/02* (2006.01)

(52) U.S. Cl.
CPC *H02N 2/12* (2013.01); *B81B 3/001* (2013.01); *B81B 3/0008* (2013.01); *B81B 3/0013* (2013.01); *B81B 7/02* (2013.01); *B81B 2201/016* (2013.01); *B81B 2201/0221* (2013.01); *B81B 2203/0109* (2013.01); *B81B 2203/0181* (2013.01); *B81B 2203/053* (2013.01); *B81B 2203/058* (2013.01); *B81B 2203/06* (2013.01)

(58) Field of Classification Search
CPC ............... B81B 2201/016; B81B 2203/0109; B81B 2203/053; B81B 2203/058; B81B 2203/06
See application file for complete search history.

(56) References Cited

U.S. PATENT DOCUMENTS

| 6,504,118 | B2 | 1/2003 | Hyman et al. |
| 6,533,947 | B2 | 3/2003 | Nasiri et al. |
| 6,760,144 | B2 | 7/2004 | Hill et al. |
| 6,822,370 | B2 | 11/2004 | Clark et al. |

(Continued)

OTHER PUBLICATIONS

Farinelli, Paola et al., "A Wide Tuning Range MEMS Varactor Based on a Toggle Push-Pull Mechanism", Microwave Integrated Circuit Conference, Oct. 2008, Amsterdam, Netherlands, pp. 474-477.

(Continued)

*Primary Examiner* — Ramon M Barrera
(74) *Attorney, Agent, or Firm* — Jacqueline J. Garner; Frank D. Cimino

(57) ABSTRACT

A MEMS electrostatic actuator includes a bottom plate affixed to a substrate and a top plate suspended above the bottom plate. The top plate has a parallel plate center section and two rotating members electrically connected to the center section. Each rotating member is attached centrally of the rotating member for rotation about an axis of rotation to a set of anchor posts. The attachment includes at least one pair of torsional springs attached along each axis, each spring comprising a rectangular metal square that twists as the rotational members rotate. Electrostatic pull-down electrodes are underneath each rotational member.

8 Claims, 15 Drawing Sheets

(56) References Cited

U.S. PATENT DOCUMENTS

| | | |
|---|---|---|
| 7,295,726 B1 | 11/2007 | Milanovic et al. |
| 7,428,353 B1 | 9/2008 | Milanovic et al. |
| 7,432,788 B2 | 10/2008 | Glukh et al. |
| 8,171,804 B2 | 5/2012 | Knipe |
| 8,488,230 B2 | 7/2013 | Smith et al. |
| 8,729,770 B1 | 5/2014 | Milanovic |

OTHER PUBLICATIONS

Solazzi, Francesco et al., "Active Recovering Mechanism for High Performance RF MEMS Redundancy Switches", Proceedings of the 40th European Microwave Conference, Sep. 28-30, 2010, Paris, France, pp. 93-96.

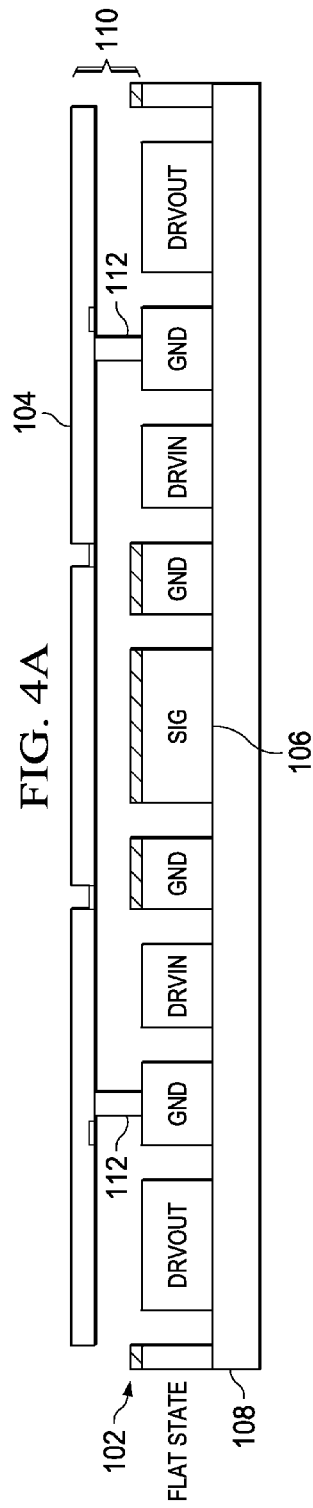
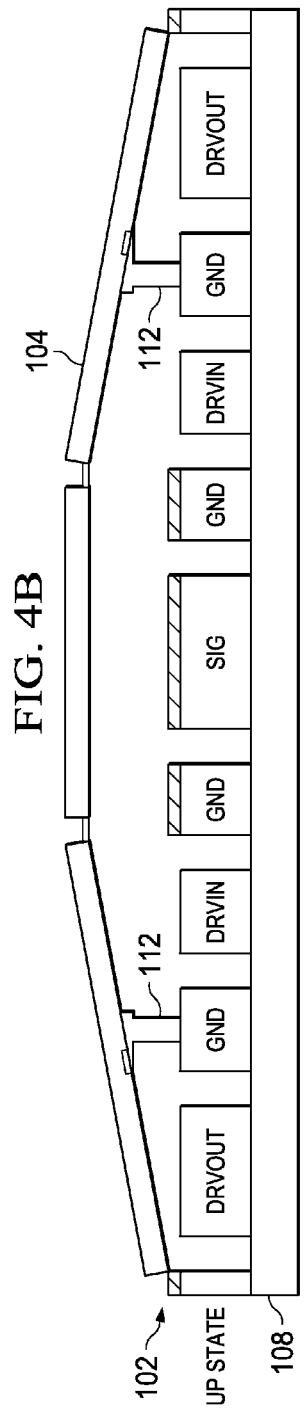
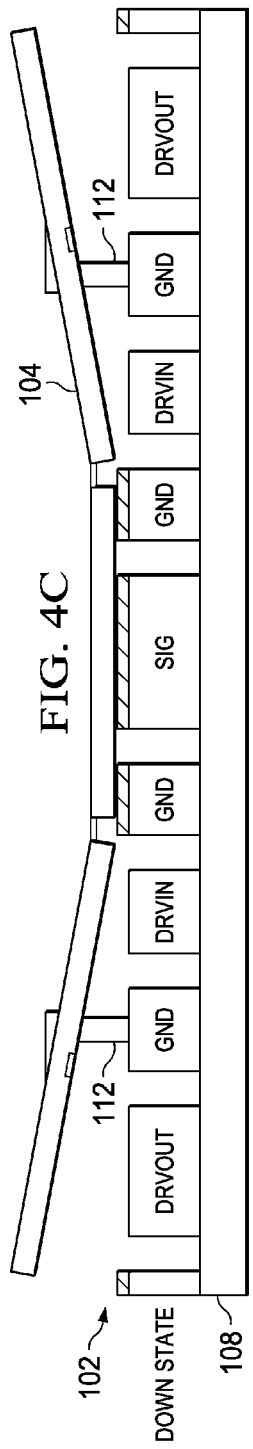

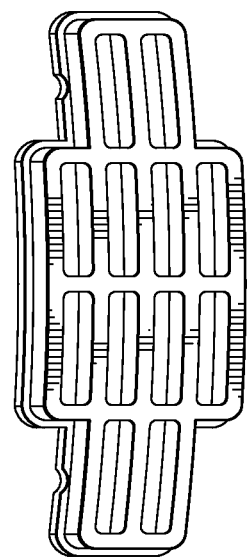
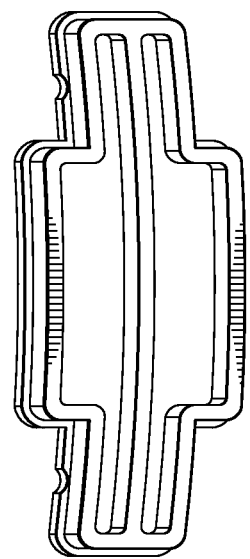
FIG. 14A　　　　FIG. 14B
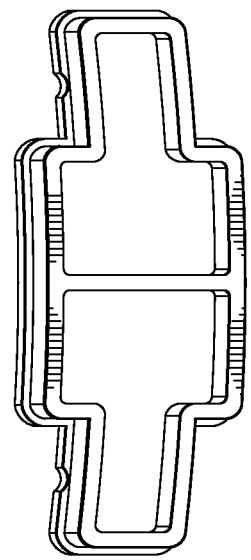
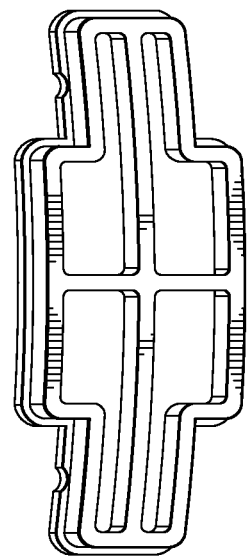
FIG. 14C　　　　FIG. 14D

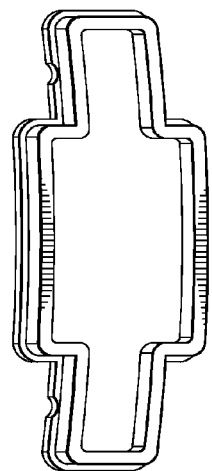 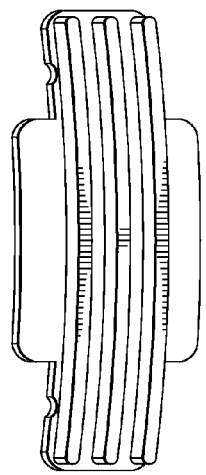 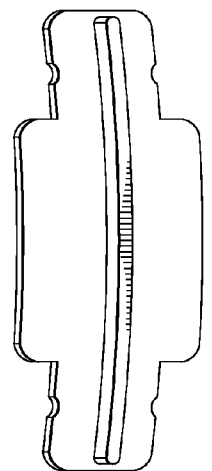
FIG. 14E    FIG. 14F    FIG. 14G
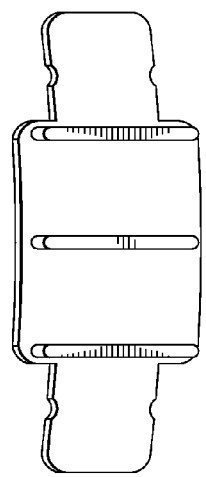 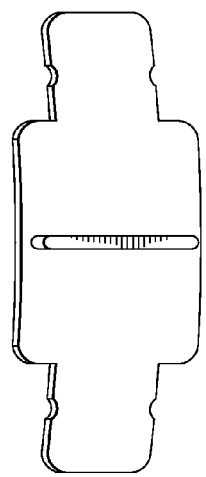
FIG. 14H    FIG. 14I

MEMS ELECTROSTATIC ACTUATOR

This application is a continuation of U.S. patent application Ser. No. 13/614,936 filed Sep. 13, 2012, which claims benefit of U.S. Provisional Application No. 61/606,041 filed Mar. 2, 2012, and U.S. Provisional Application No. 61/534,157 filed Sep. 13, 2011, the entireties of all of which are hereby incorporated herein by reference.

A MEMS electrostatic actuator and methods for its actuation are described.

BACKGROUND

As shown schematically in FIG. 1, a MEMS electrostatic actuator 10 (also known as a capacitive actuator) generally comprises two parallel electrodes, one electrode (the "bottom plate") 12 of which is typically fixed to a substrate 14 and the other electrode (the "top plate") 16 of which is suspended with a spring suspension 18 spaced by an air gap 20 above the bottom plate. A thin solid dielectric film 22 is deposited on the surface of the bottom plate 12 to prevent shorting. A voltage is applied between the two electrodes, creating an electric field that produces an attractive force between the two electrodes 12, 16. This force causes displacement of the top plate 16, until the top plate 16 makes contact with the dielectric 22 on the bottom plate 12. Once the voltage is removed, the top plate 16 returns to its original position under the restorative force of spring suspension 18.

A parallel plate actuator with a torsional architecture is described in P. Famelli, et al., "A Wide Tuning Range MEMS Varactor Based on a Toggle Push-Pull Mechanism," Microwave Integrated Circuit Conference, 474-477 (2008), and in F. Solazzi, et al., "Active Recovering Mechanism for High Performance RF MEMS Redundancy Switches," Proceedings of the 40$^{th}$ European Microwave Conference, 93-96 (September 2010), both of which are hereby incorporated herein by reference.

One problem that arises in connection with MEMS capacitive actuators is stiction—static friction associated with adhesion of contacting surfaces. Stiction occurs when Van der Waals forces and the like cause the top plate to stick down on the dielectric on the bottom plate, even after the actuation voltage is removed.

A second problem arises when the top plate is landed on the bottom plate. At this point, the electric field across the thin solid dielectric that separates the two plates is very high. This causes electrostatic charge to be injected into the dielectric, a phenomenon known as dielectric charging. The charged dielectric has its own contribution to the electric field between the two plates, and it can cause undesirable effects: It can change the release voltage, the voltage at which the top plate returns to its original position. It can change the land voltage, the voltage at which the top plate lands on the bottom plate. It can shift the voltage that produces minimum capacitance away from 0V. These issues are problems for repeatability and reliability, and they can cause early device failure.

A third problem that arises when the device is used as a variable capacitor for RF applications is self-actuation. When RF energy is applied to the plates, the RMS voltage of the RF signal can cause the top plate to move and potentially even land on the bottom plate, even if there is no DC actuation voltage present. This is especially a problem in high power RF applications, as it limits the power-handling specification for the device.

A fourth problem, similar to self-actuation, is self-latching. In RF applications, when the top plate is landed on the bottom plate, the RMS voltage on the RF signal on the bottom plate can hold the top plate down and prevent it from releasing, even when the DC actuation voltage is removed. This effectively prevents hot-switching, and presents a significant problem if the device is used in CDMA systems. The self-latching voltage is usually much lower than the self-actuation voltage.

A fifth problem is related to the flatness of the suspended top plate. Since the device is a parallel plate capacitor, both plates should ideally be flat and parallel. However, residual stresses from manufacturing can cause the top plate to curl. When the top plate is landed on the bottom plate, this curling creates an air gap between the two plates, greatly reducing on-state capacitance. This is illustrated in FIG. 2 which shows top plate 16 landed on solid dielectric layer 22 above bottom plate 12 on substrate 14. Top plate 16 is curled downward making contact peripherally with dielectric 22 over bottom plate 12 and leaving an air gap 20' centrally between the regions of contact.

Other problems are slow switching speed and slow actuator settling time upon release. When the DC actuation voltage is removed, the top plate moves upward due to the restoring force of its spring suspension. Generally, this mass-spring system is underdamped, causing oscillation. The problem arises when the settling time for the oscillation is longer than the maximum switching time of the system, for example in transmit/receive switching application for GSM mobile handsets.

Another problem is one of system integration. In a typical RF handset application, there is no high voltage power supply available. Adding an off-chip supply is highly undesirable due to cost and board real estate. Therefore, the DC actuation voltage must be supplied by on-chip circuitry. It is a manufacturing challenge to co-locate MEMS and CMOS components. RF CMOS processes may provide good RF performance, but may be cost prohibitive. Also, they may not have the right component set required to generate an on-chip electrostatic supply. On the other hand, standard mixed signal processes provide poor RF performance. Moreover, there is a limit to the magnitude of the voltage that can be generated on the chip. As such, the actuation voltage of the MEMS structure must be below that limit.

SUMMARY

A MEMS electrostatic actuator and methods for its actuation are described that address the above-identified problems.

BRIEF DESCRIPTION OF THE DRAWINGS

Example embodiments are described with reference to accompanying drawings, wherein:

FIGS. 3-20 illustrate example embodiments, and

DESCRIPTION OF EXAMPLE EMBODIMENTS

Figure 1:
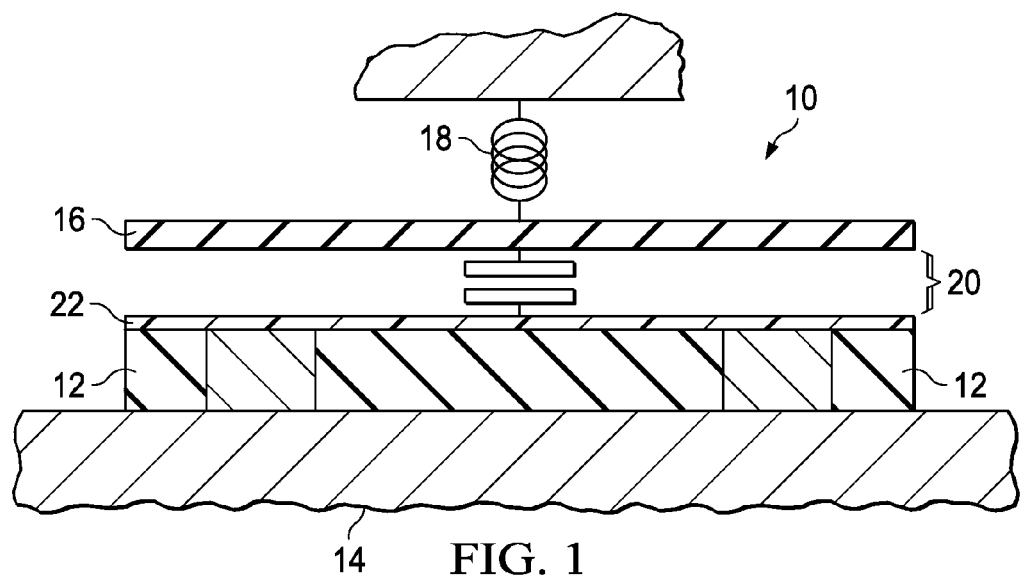
FIG. 1 is a schematic representation of a parallel plate MEMS electrostatic actuator.
Figure 2:
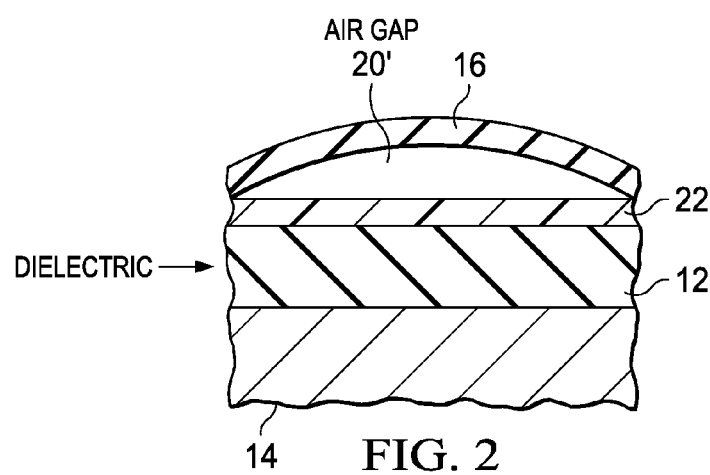
FIG. 2 is a schematic representation illustrating the problem of curling.

An example MEMS structure 100 including a plurality of electrostatic actuators 102 is illustrated in FIG. 2. As shown in FIGS. 4A-4C, each actuator 102 has a first capacitor plate section 104 (the top plate) that is suspended above and a second capacitor plate section 106 (the bottom plate) that is affixed to a substrate 108. The two sections 104, 106 are separated by an air gap 110, and the suspended section is supported by anchor vias 112.

To address the problem of dielectric charging, the embodiment uses a torsional actuation. An articulated structure of a type suitable for torsional actuation is illustrated in commonly owned U.S. Pat. No. 8,171,804, incorporated herein by reference. The suspended portion 104 of the actuator is split up into three sections as illustrated in FIGS. 5-8: a parallel plate center section 114, and two rotating paddle-shaped drive members 116. All three sections 114, 116 are electrically shorted to each other.

Each drive member 116 has anchor portions 118 attached to the substrate through a set of four anchor posts 112 at positions 120 (see FIG. 7) centrally of the drive member 116. The anchor members 118 connect to remaining portions of the drive members through a torsion hinge member 122 which provides a horizontal axis of rotation 124 about which the drive member can pivot relative to the substrate 108. The drive members 116 are disposed so that their respective axes 124 are parallel.

Figure 3:
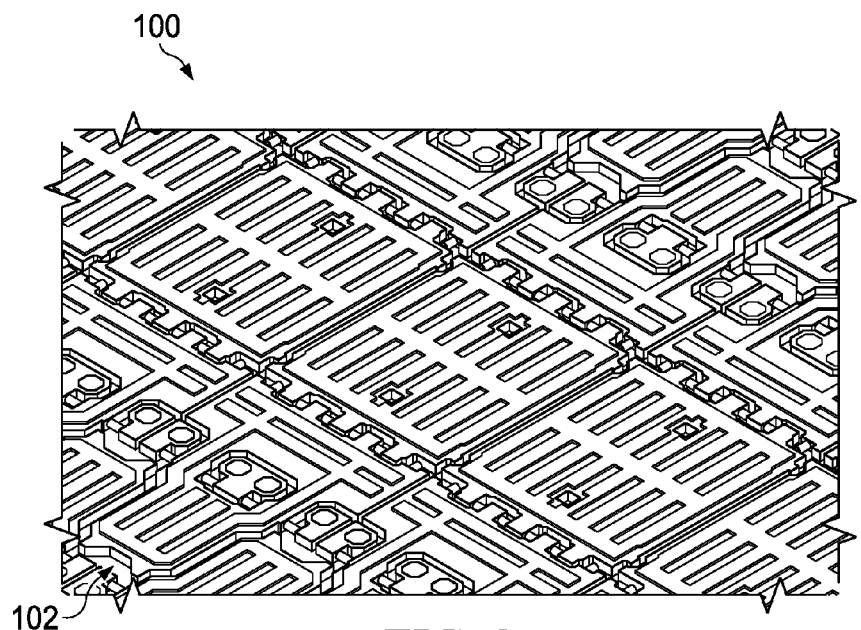
Figure 5:
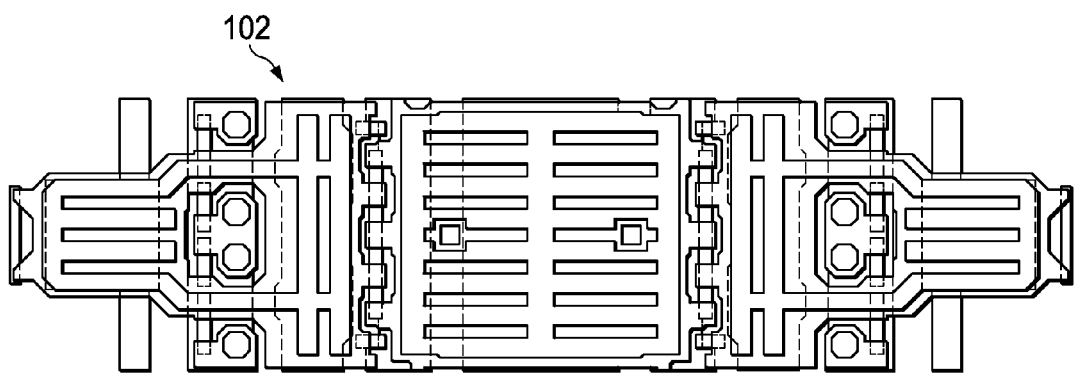

The main portion 126 of each drive member 116 is formed in a metal layer and including corrugations or raised portions 128 which provide rigidity to an otherwise generally planar, flat teeter-totter structure which pivots about the axis 124. The main portion has inner and outer ends 130, 132 laterally dimensioned with outer ends 132 having a smaller width dimension (direction parallel to axis 124) that inner ends 132, allowing like ends of drive members 116 of neighboring actuators 102 to be brought into interdigitated positions that enable staggered closer packing of pluralities of such structures (see FIG. 3). The wider inner ends 132 match a generally uniform width dimension of a corresponding plate section 114.

The plate section 114 has a main section 136 of generally rectangular shape. It, too, is generally planar with the addition of undulations (corrugations or recesses) to impart rigidity (see FIG. 8). A width-wise extending pivot pin member 140 is provided at opposite ends of the main section 136, traversing longitudinally directed tab extensions 142 formed at opposite ends of the main section 136. Like tab extensions 144 (FIG. 7) formed at adjacent ends of the drive members 116 are disposed to extend into respective openings 146 between adjacent tab extensions 142 and contact the member 140, allowing relative pivotal motion of the members 114, 116 about horizontal axes 148—parallel with the axes 124—established by the members 140. Openings 152 formed through the main section 136 provide release holes to prevent stiction when the main section 136 is in the actuated downward position.

Figure 6A:
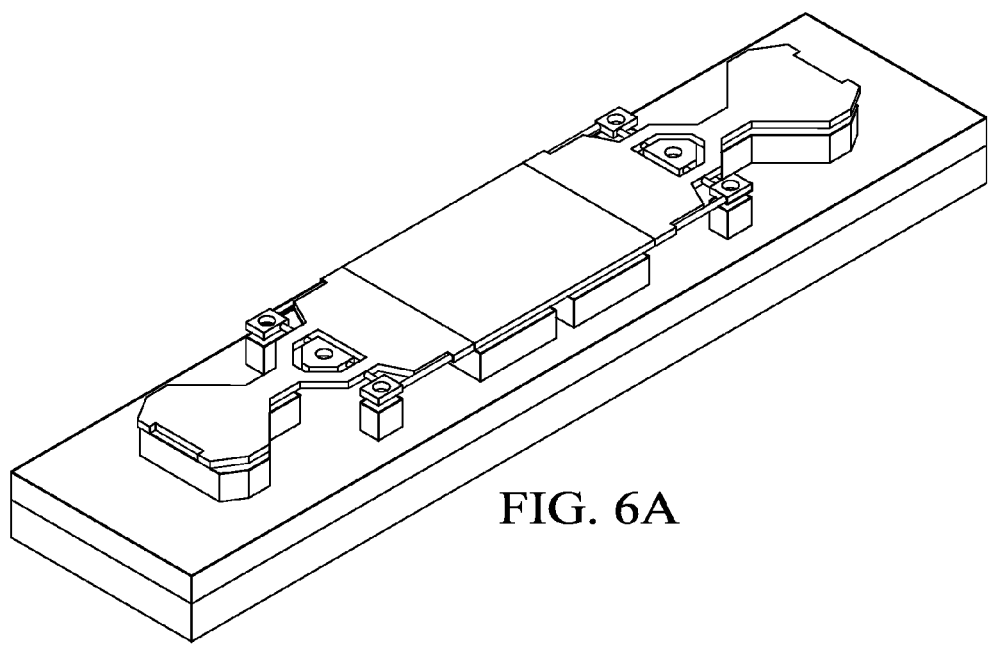
Figure 6B:
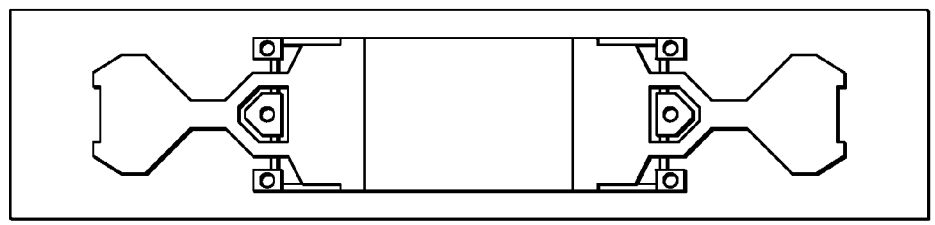
Figure 6C:
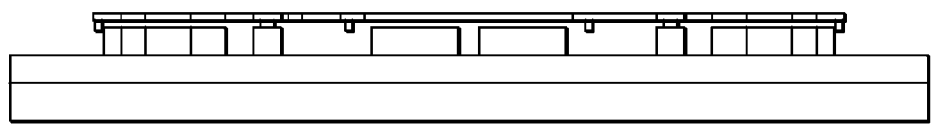
Figure 7:
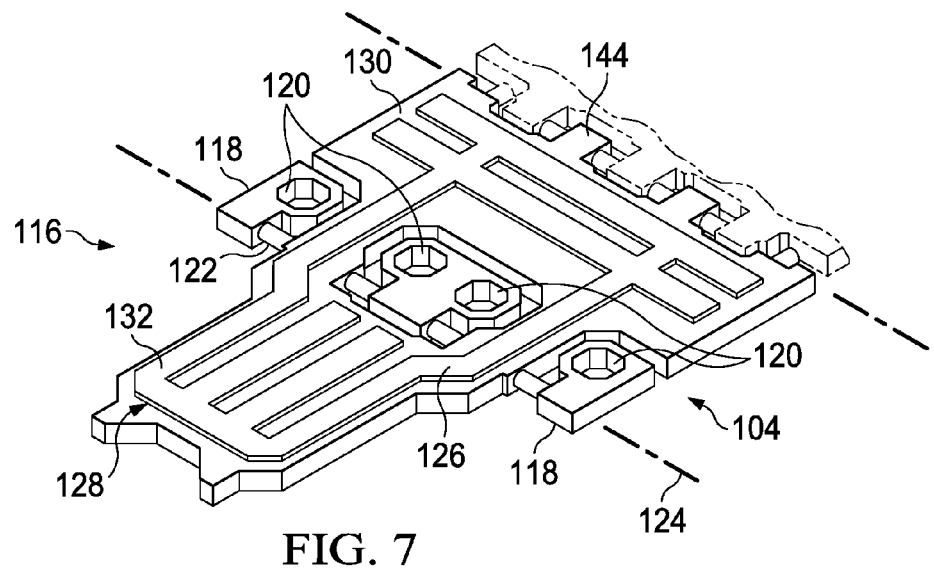
Figure 8:
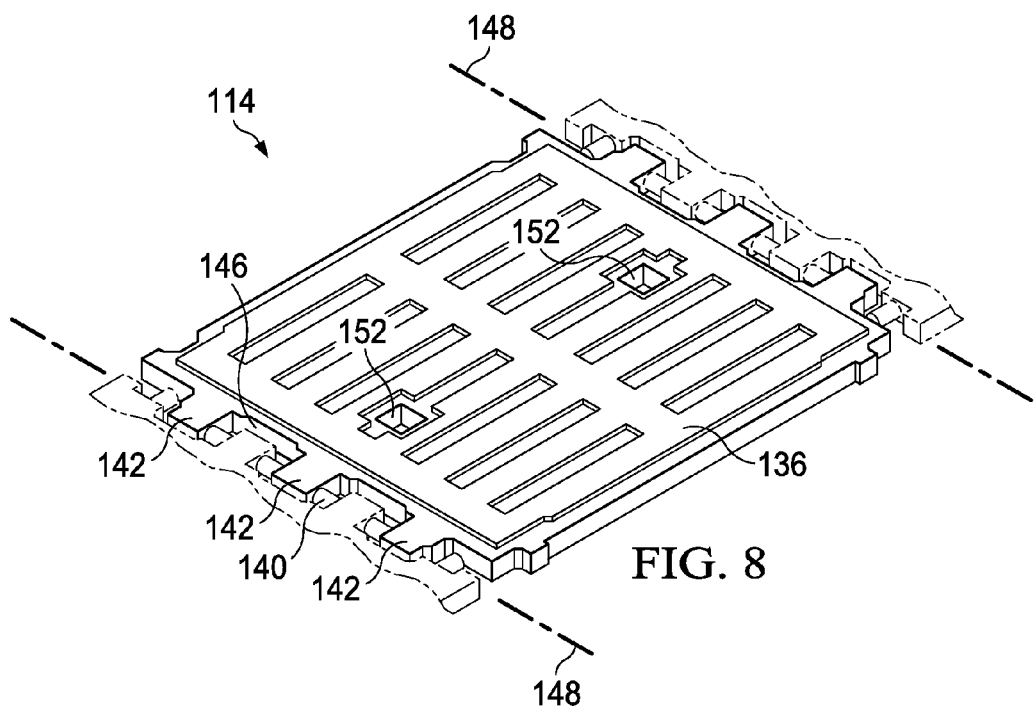
Figure 9:
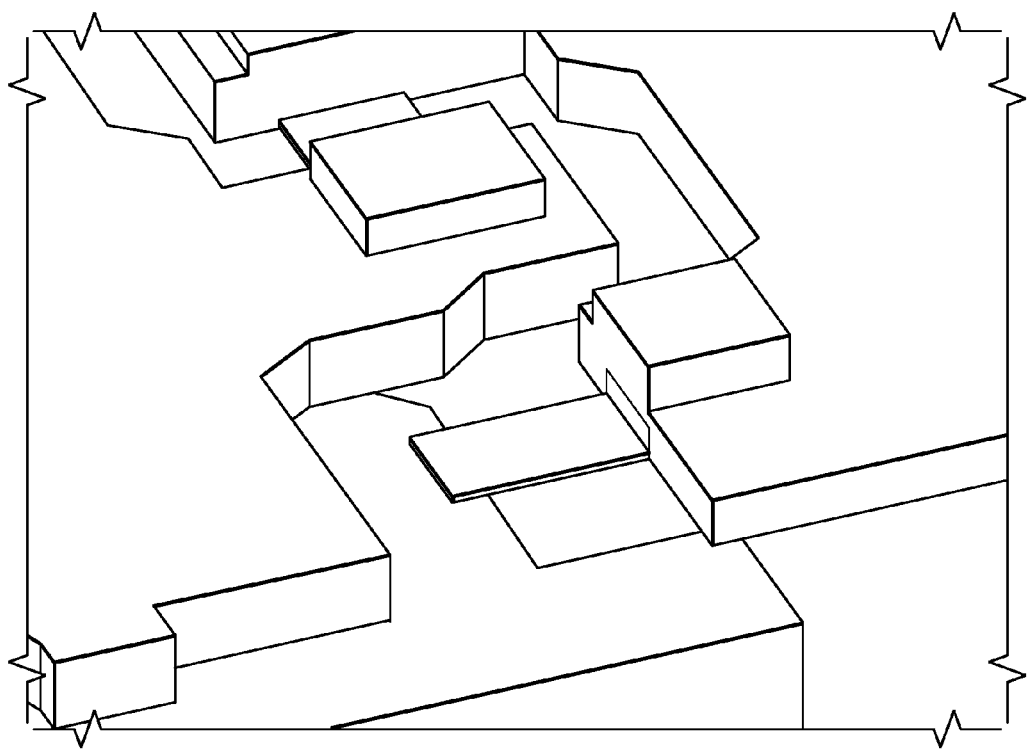
Figure 10:
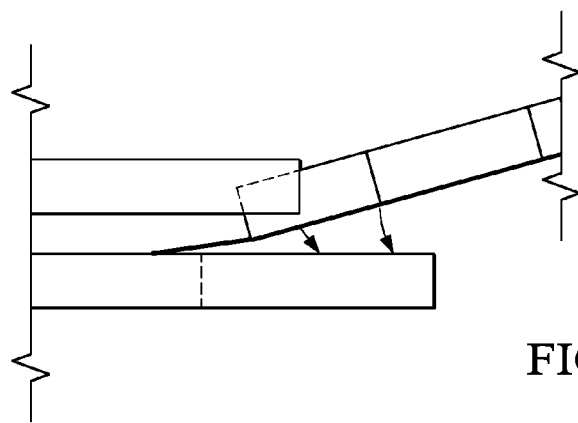
Figures 11A, 11B, 11C, 11D:
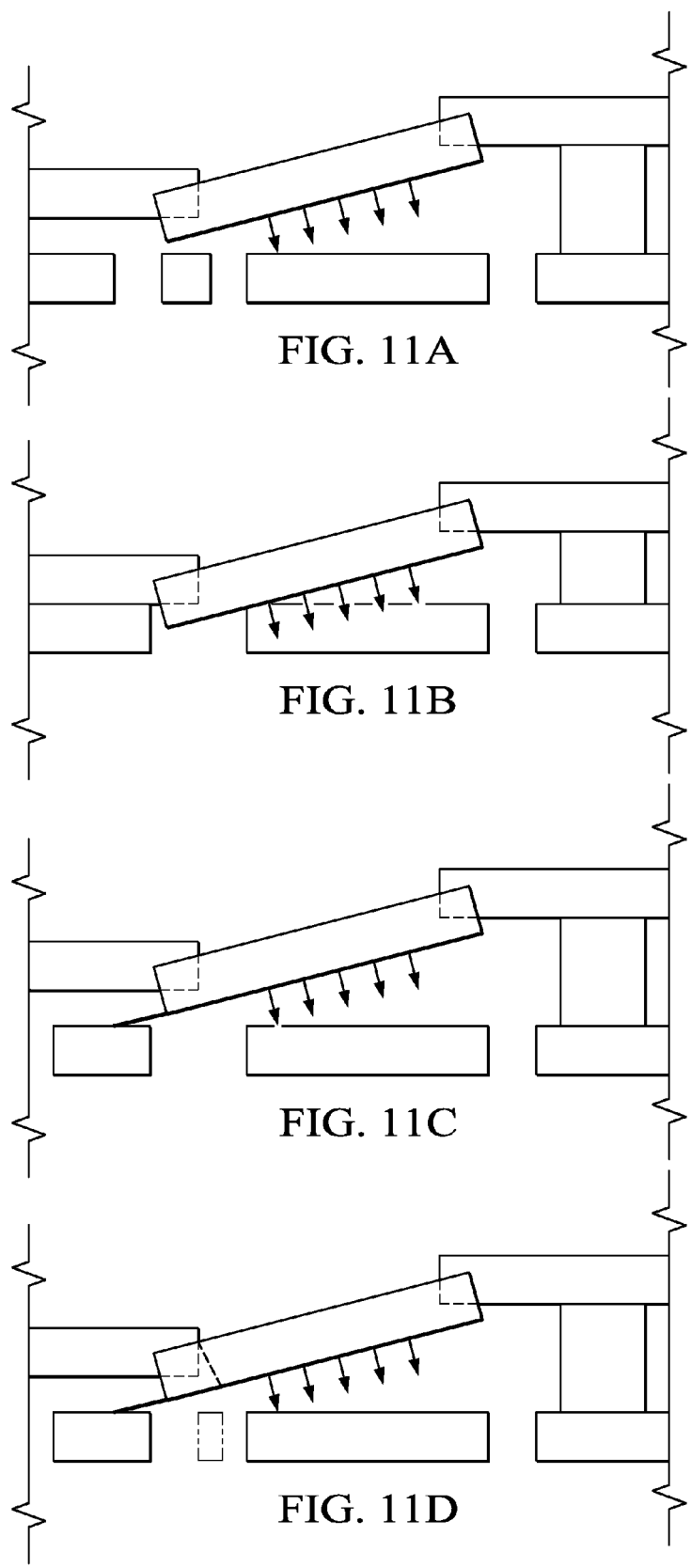
Figure 12:
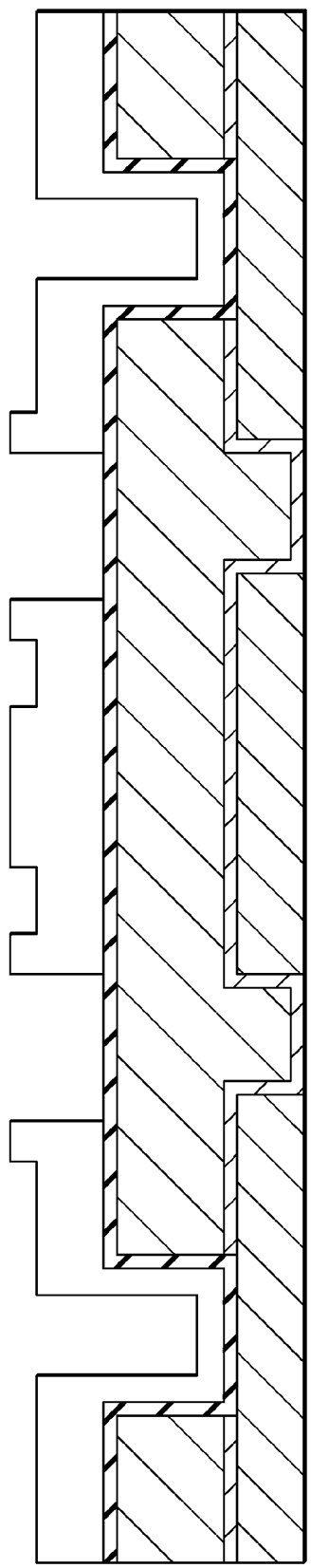
Figure 13A:
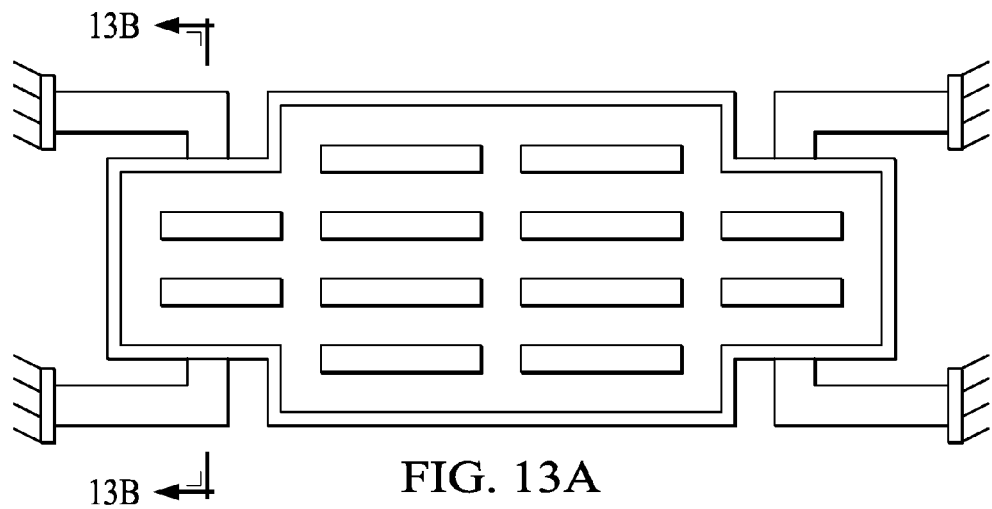
Figure 13B:
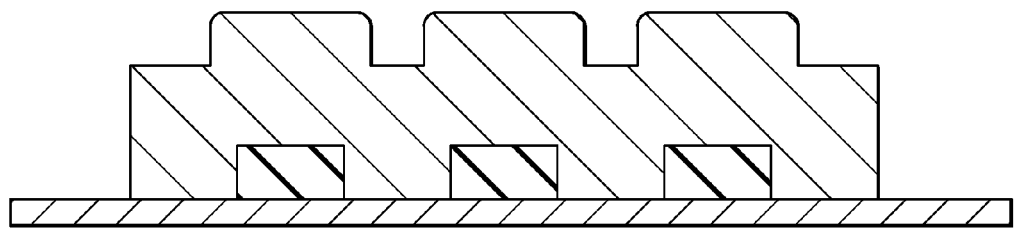
Figure 15:
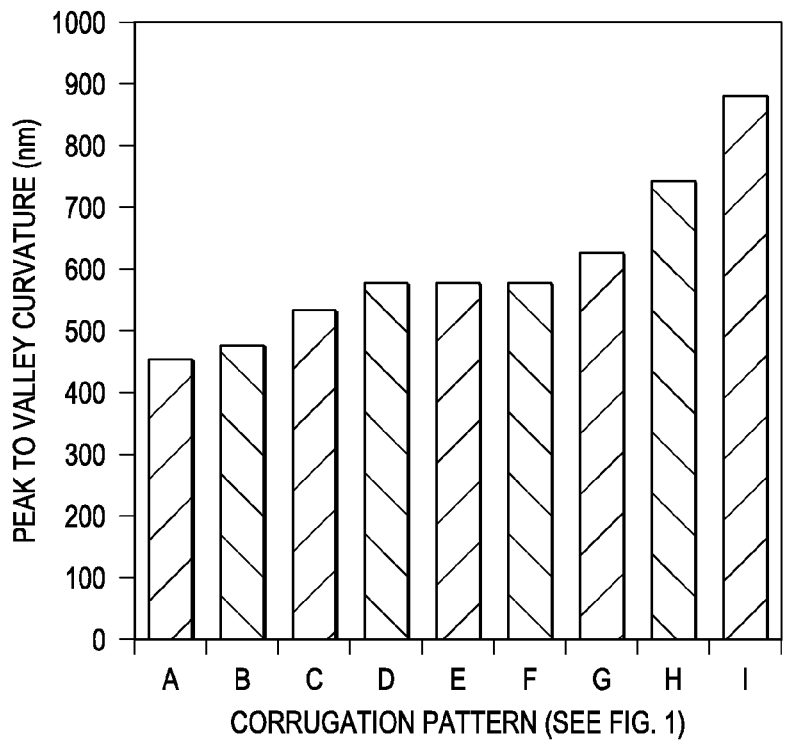
Figure 16:
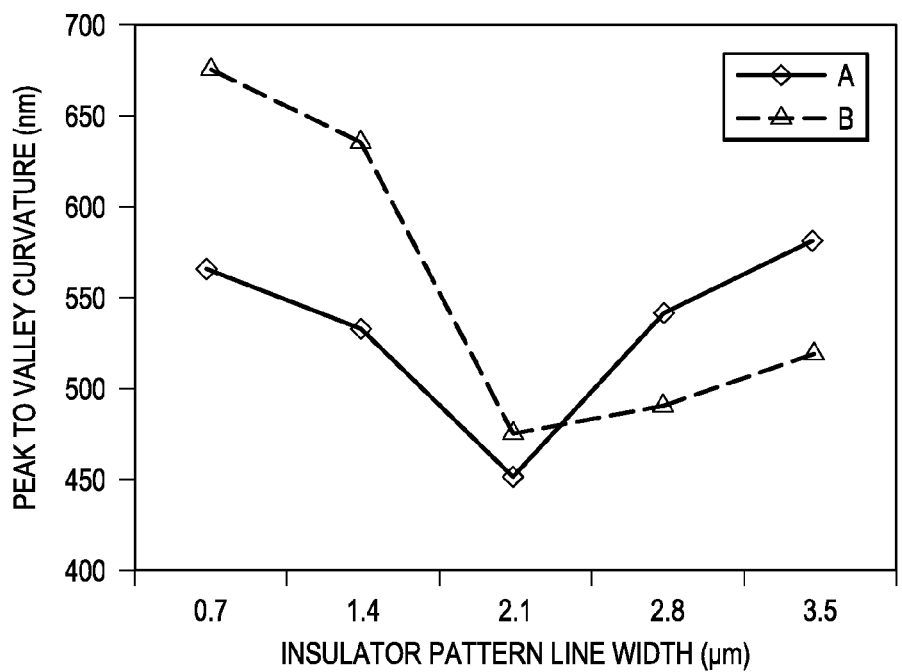
Figure 17:
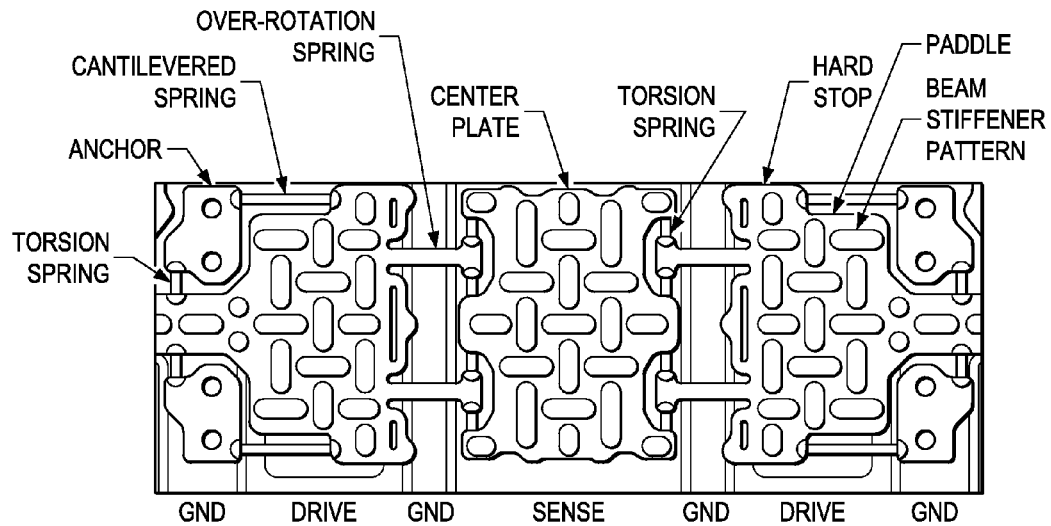
Figure 19:
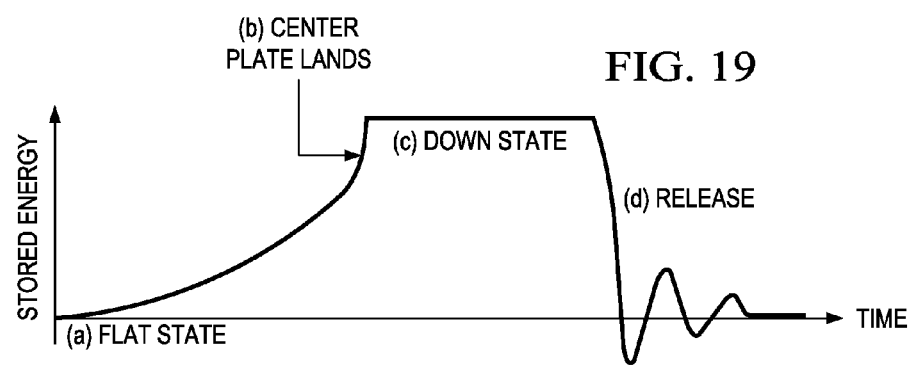
Figure 18A:
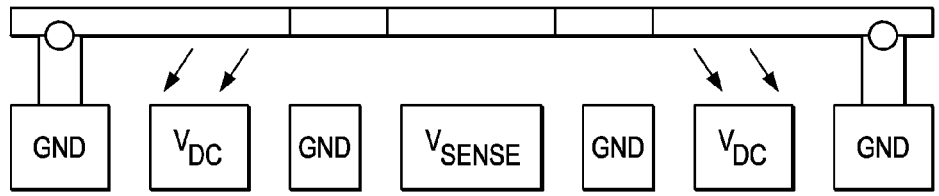
Figure 18B:
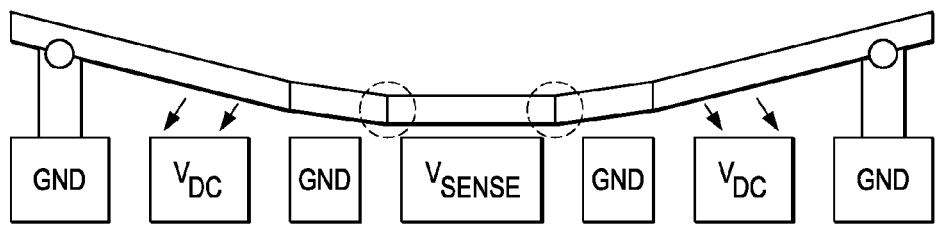
Figure 18C:
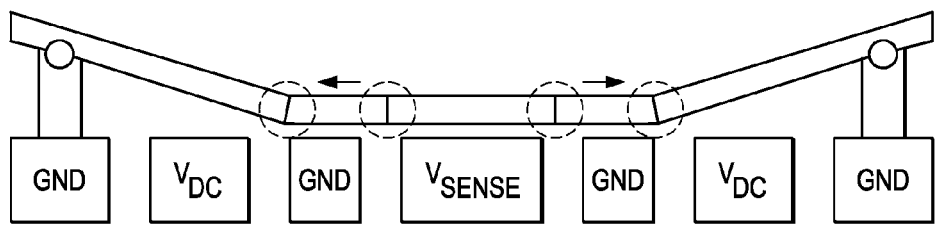
Figure 18D:
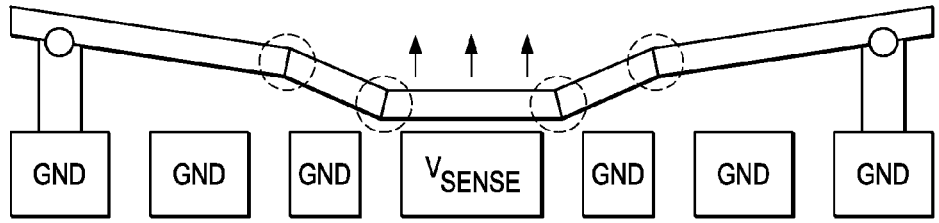
Figure 20:
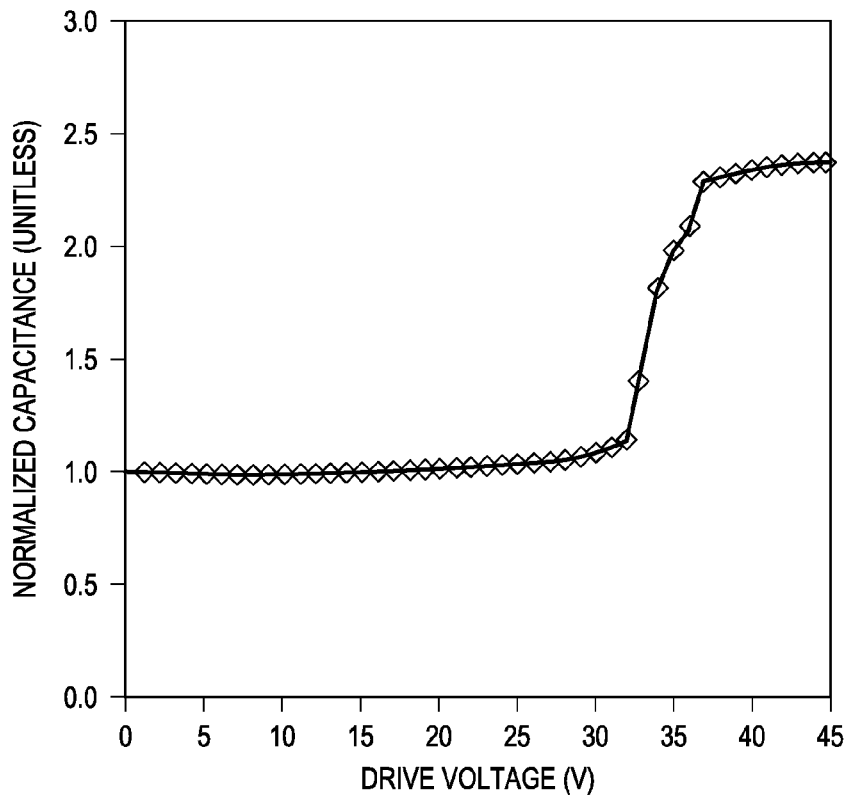
Figure 21:
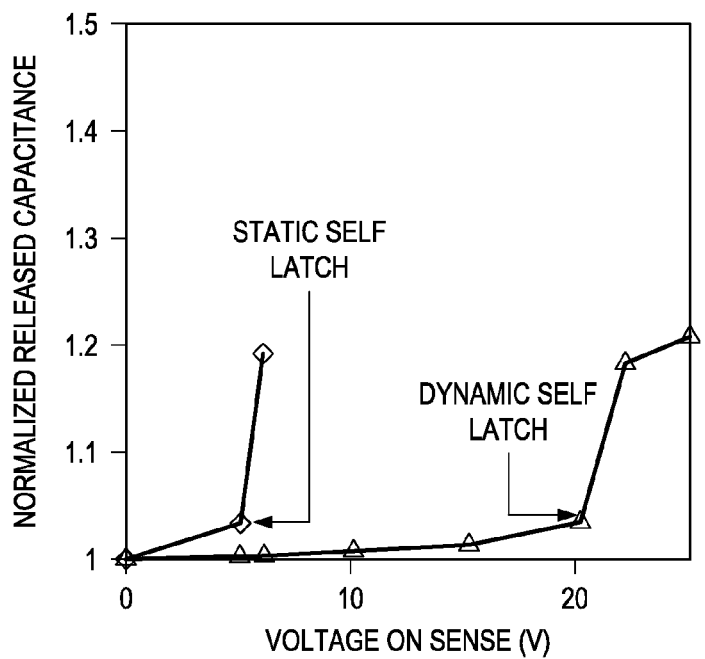
FIG. 21 shows static electrostatic hold down (5V) and dynamic holddown (20V) plots. Voltage is applied to the SENSE electrode in the down state, the varactor is released, and C is measured. In the dynamic test, the switching waveform on the DRIVE electrode has a fall time of <100 ns, while in the static test it is much slower.

The depicted actuator 102 has four parallel horizontal axes of rotation 124, 148 enabling vertical movement of the main section 136 while keeping the planar section generally horizontal. As illustrated in FIGS. 6A-6C, one to two pairs of torsional springs are positioned along the axes, each consisting of a thin rectangular metal square that twists as the rotational members rotate.

As shown in FIGS. 4A-4C, electrostatic pull-in electrodes (i.e. drive electrodes) DRVIN are positioned on substrate 108 below inner portions 130 of drive members 116 between vias 112 and hinge members 122. Electrostatic pull-out electrodes DRVOUT are positioned on substrate 108 below outer portions 132 of drive members 116 between vias 112 and the outermost portions (away from plate section 114) of drive members 116. The electrostatic electrodes act in pairs, with the inner set (DRVIN) acting together and the outer set (DRVOUT) acting together. When an electric potential difference is placed between the inner set of drive electrodes and the top plate, an electrostatic force is exerted on the top plate. This causes the two drive members 116 to rotate inwards about their respective axis 124 (toward the plate section 114), which in turn causes the parallel center plate 114 to move downwards while remaining parallel to substrate 108. As the potential difference increases, there will be a point at which the electrostatic force pulling the structure down becomes greater than the spring restoring force provided by the torsional springs. At this point, the top plate collapses down onto the dielectric layer formed over the bottom plate 106. This is called pull-in and represents movement into the position shown in FIG. 4C.

In accordance with an aspect of the invention, the inner edge of each rotating member 116 includes thin rectangular protrusions known as "spring tips" extending longitudinally, laterally outward of and generally parallel with the tab extensions 144. These spring tips extend inwardly beyond the inner edge of the rotating member. When pull-in occurs, the first parts of the suspended section to touch elements disposed on substrate 108 are the spring tips. These touch the GND electrodes shown in FIG. 4C which are located below the pivot pins 140. The center plate 114 then lands on a thin dielectric layer covering the bottom plate 106 located below it. Plate 106 is illustrated by the signal electrode SIG shown in FIGS. 4A-4C. Plate 106 (i.e., SIG electrode) is covered with the thin dielectric layer to prevent electrical shorting. In the inwardly downward movement of drive members 116, after the spring tips have made contact, hard stops in the form of rigid protrusions (hard stops) on the inner edges of the rotating drive members 116 next touch down on the GND electrodes, thereby preventing further rotation.

No portion of the rotating beams actually touches the biased drive electrodes. Since there is no direct electric contact and adequate air gap space between the drive electrodes and the three top plate segments, the field across the surface dielectric is greatly reduced. This greatly reduces oxide charging.

Furthermore, the device is designed to be bi-stable. The top plate can either be "pulled-in" or "pulled-out". In pull-in, the DRVIN electrodes are biased, causing the rotational beams to rotate inward, and causing the parallel center beam to move downward. In pullout, the bias is removed from the DRVIN electrodes and applied to the DRVOUT electrodes. This causes the rotational beams to rotate outward, and the parallel center beam moves upward. There are hard stops in both the pull-in and pull-out cases, preventing over rotation and providing two mechanically stable states.

The top plate will return to a flat state (FIG. 4A) if bias is removed from all DRV electrodes. However, for the illustrated configuration the flat state may not be mechanically stable and achieving a flat state (no biasing) position may be influenced by residual charge in the surface dielectric, on the memory of the springs, and other phenomena. Further, in the absence of hard stops, the flat state may have a long settling time before reaching a steady state. For these reasons, the flat state is not utilized as a neutral position in operation of the illustrated device. (Of course, additional electrodes or other accommodation may be made if utilization of the flat state is desired.)

Switching directly between the pull-in and pull-out state solves several of the problems outlined above. First, it leads to fast switching speeds. Mechanical hard stops in both the up and down state mean that mechanical ringing is quickly damped out through the substrate. The device settles quickly and reaches a steady state much faster than it would if the flat state were used. Furthermore, since the device is electostatically held in the up state, small amounts of residual charge in the dielectric on the DRVIN electrodes will not have an effect on the position or stability of the up state. Also, the pull-out state greatly increases self-actuation voltage. Since the device is actively held in the up state, it takes much more voltage on the SIG electrode to disturb the top plate when it is pulled out. Finally, the pull-out feature causes the parallel portion of the top plate to be pulled further away from the SIG electrode than it would otherwise be in the flat state. Since it is further away, any voltage on the SIG electrodes exerts less force on the top plate (since force is proportional to the inverse square of distance), further increasing the self-actuation voltage. The capacitance between the SIG electrode and the top plate in the up state is also reduced.

The stiction problem is addressed by several design features. First, stiction is a function of the area in which the top and bottom plates come into intimate contact. The surface of the bottom electrode is made very rough, with a peak-to-valley surface roughness around 800 A. This roughness is achieved by making the bottom electrode 3 um thick, allowing large grains to form in the metal. These grains produce surface roughness. The roughness limits the amount of area in which the top and bottom plates come into intimate contact, thereby reducing stiction.

A second design feature for stiction reduction is the inclusion of notches in the edges of the top and bottom plates. Stiction forces tend to be stronger along edges than along main surfaces. Thus, even if a main surface of the top plate releases off the bottom plate, one of the edges might still stick, causing the parallel center plate to become torqued at an angle. Adding small notched protrusions to the edges of the top and bottom plates greatly reduces the length of edge that could potentially stick.

A third design feature that helps with stiction is the addition of the spring tips, already mentioned. As these spring tips land, they deflect and thereby store energy. When the pull-in voltage bias is removed, the spring tips release the stored energy, helping the top plate to pop off the surface of the bottom plate. It is important to note that the force due to the pull-in voltage bias is much stronger when the two plates are close together compared to when they are far apart. Since the spring tips do not make contact and do not start deflecting until the top and bottom plates are brought close together, they can take advantage of the additional electrostatic force to store an extra "kick" of energy. This is similar to the energy storage capability of spring tips used to provide a restorative force in the deflection of micromirrors used in digital micromirror devices (DMDs).

A fourth design feature that helps with stiction is the use of torsional springs having high restoring force. Compared to an SPD DMD micromirror, the torsional springs in the described capacitive actuator are much shorter but with a similar thickness, leading to higher restoring force. There are also 4 to 8 pairs of torsional springs (one to two pairs along each of the four axes of rotation), compared to the single pair in a DMD micromirror. The total restoring provided by the torsional spring and spring tips in an implementation of the described actuator is 3-5 uN.

One of the consequences of high restoring force is that it may make the top plate difficult to pull down. The electrostatic pull-in force must typically be greater than the restoring force. The need for large pull-in force can be met by increasing the pull-in bias voltage, but it may be desirable to keep the bias voltage low so that it can be driven by on-chip CMOS circuitry. Therefore, increased pull-in force may instead be accomplished through use of large pull-down electrodes. Since the outer rotation axis acts as a fulcrum point, the further the pull-down electrode extends laterally away from the fulcrum, the larger the pull-down force will be. This is due to the multiplication of mechanical force provided by the lever that is formed by the fulcrum.

To take full advantage of the lever effect, it may be necessary to make the actuator very long. Long levers produce greater leverage than short levers. Long actuators may face two main problems, however: one is curling of the suspended top plate due to residual manufacturing stresses, and the other is reduced capacitance density since such a large area is occupied by the pull-down electrodes instead of the signal electrodes. The second problem is partially alleviated by making the outer portion of the actuator narrow, so that they the outer portions can be staggered and interleaved with adjacent actuators. This allows longer actuators with a higher overall capacitance density for the array.

Also, a low pull-down voltages (20V-30V) of the actuator is made possible because the torsional hinges are very thin but are manufactured with good uniformity across the wafer. The thinness of the hinge metal is accomplished through the use of a superstructure manufacturing flow used elsewhere in connection with DLP™ DMD devices. A DMD device fabrication process is described in M. Mignardi and R. Howell "The Fabrication of the Digital Micromirror Device," Commercialization of Microsystems '96 (1996), incorporated herein by reference.

Such manufacturing flow also allows the actuator to be built directly on top of the CMOS circuitry that drives it. However, standard CMOS is built on low resistivity substrates, which inherently result in high RF loss. This system-integration issue is resolved by including a solid metal ground shield between the CMOS and the variable capacitor. The ground shield isolates the RF energy from the substrate, so it does not experience high substrate loss. However, that ground shield adds unwanted parasitic capacitance that can reduce the capacitance ratio. To prevent this, a stack of thickened metals and thickened dielectrics can be used to increase physical distance between the variable capacitor and the ground shield. This extra distance reduces the parasitic capacitance of the ground shield.

The third and fourth design features that combat stiction also increase self-latch voltage. This is because both stiction and self-latch result from an attractive force between the top and bottom plates that tries to keep the top plate from pulling out. It is noted that the electrostatic force from RF energy on the SIG electrode varies with the inverse of the gap squared. Thus, even through the spring tips release their energy over only a short z-direction (vertical) distance, the self-latching force becomes significantly weaker over that distance, allowing the device to pull out.

The device can also benefit from the dynamic release of energy by the spring tips. Once the device is in the landed state, the spring tips can be further depressed and then released by pulsing the bias voltage on DRVIN. If this pulse matches the resonant frequency of the spring tips, the top plate will receive a resonant boost that amplifies the pull-out force by a factor of two to four times (2×-4×).

There are also design features intended to improve the planarity of the suspended beam. Firstly, the overall lateral dimensions of the actuator may be kept small (<100 um). Residual stresses from manufacturing may add up over the length of the suspended beam, so a shorter beam may be less prone to stress-curling. Also, since the top plate may be suspended over 3 um thick surface electrodes, the topology of the surface electrodes may be carried through the sacrificial layer up to the top plate. To prevent this, a planarization process can be employed in which the gaps between surface electrodes is filled with extra sacrificial material. That way the top plate can be deposited on a flat surface and avoid taking on the topology of the metal underneath it.

Furthermore, oxide ridges may be embedded into the suspended top plate. These oxide ridges provide added z-direction rigidity, allowing the actuator to resist curling due to residual stresses from manufacturing.

The suspended plate may be formed by first depositing a thin hinge material on top of a sacrificial layer. A hard oxide mask may then be deposited and patterned in order to define the torsional hinges and spring tips. A thick beam layer is then deposited and patterned to form the suspended plates. The pattern etch goes all they way down through the hinge layer, and the hard oxide mask protects the hinge from the etch in the areas where the torsional springs and spring tips are to be defined. The oxide mask is then stripped. However, in order to produce oxide ridges, the hard oxide mask is left embedded within the beam in corrugation patterns designed to give maximum z-direction rigidity. This produces a hinge-oxide-beam sandwich, where the beam completely covers the oxide ridges and protects them from the oxide strip process. Etch holes are also included in the beam for proper undercut (removal of sacrificial layer).

Those skilled in the art to which the invention relates will appreciate that the disclosed example embodiments may be modified and also that many other embodiments are possible within the scope of the claimed invention.

What is claimed is:

1. A MEMS electrostatic actuator device comprising an array of MEMS actuators, each MEMS actuator comprising:
   a bottom plate affixed to a substrate, wherein the bottom plate is a signal electrode;
   a top plate suspended above the bottom plate; the top plate comprising a parallel plate center section and two rotating drive members electrically connected to the center section, wherein the center section has openings to reduce stiction;
   each rotating drive member is attached to a set of anchor posts, wherein the rotating drive members enable vertical movement of the center section; and
   electrostatic pull-down electrodes underneath each rotating drive member.

2. The MEMS electrostatic actuator device of claim 1, wherein the rotating drive members have an outer end width that is less than an inner end width so that MEMS actuators of the array of MEMs actuators may be interdigitated.

3. The MEMS electrostatic actuator device of daft wherein the parallel plate center section includes undulations to impart rigidity.

4. The MEMS electrostatic actuator device of claim 1, wherein the rotating drive members include spring tips at an end of each rotating member.

5. The MEMS electrostatic actuator device of claim 1, wherein the bottom plate has a rough surface due to large grains formed in a metal of the bottom plate.

6. The MEMs electrostatic actuator device of claim 5, wherein the bottom plate has a peak-to-valley surface roughness of around 800 Å.

7. The MEMs electrostatic actuator device of claim 1, wherein the top plate has notches at the edges of the parallel plate center section.

8. A MEMS electrostatic actuator device comprising an array of MEMS actuators, each MEMS actuator comprising:
   a bottom plate affixed to a substrate, wherein the bottom plate is a signal electrode;
   a top plate above the bottom plate, the top plate comprising a parallel plate center section and two rotating drive members electrically connected to the center section, wherein the center section has openings to reduce stiction;
   each rotating drive member is attached centrally of the rotating member for rotation about an axis of rotation to a set of anchor posts; the attachment including at least one pair of springs attached along each axis, each spring comprising a rectangular metal square that twists as the rotating drive members rotate;
   the rotating drive members including spring tips at inner ends;
   the rotating drive members having an outer end width that is less than an inner end width wherein the MEMS actuators of the array of MEMS actuators are interdigitated;
   the parallel plate center section having notches at edges adjacent the rotating drive members;
   a pivot pin member traversing the notches allowing relative pivotal motion of rotating drive members; and
   electrostatic pull-down electrodes underneath each rotating drive member.

* * * * *